US011466178B2

(12) United States Patent
Kim et al.

(10) Patent No.: US 11,466,178 B2
(45) Date of Patent: Oct. 11, 2022

(54) BACK-GRINDING TAPE

(71) Applicant: LG CHEM, LTD., Seoul (KR)

(72) Inventors: Eun Yeong Kim, Daejeon (KR); Sera Kim, Daejeon (KR); Kwang Joo Lee, Daejeon (KR); Sang Hwan Kim, Daejeon (KR); Sung Chan Park, Daejeon (KR); Mi Seon Yoon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 127 days.

(21) Appl. No.: 16/969,255

(22) PCT Filed: Mar. 7, 2019

(86) PCT No.: PCT/KR2019/002671
§ 371 (c)(1),
(2) Date: Aug. 12, 2020

(87) PCT Pub. No.: WO2019/182271
PCT Pub. Date: Sep. 26, 2019

(65) Prior Publication Data
US 2021/0002518 A1    Jan. 7, 2021

(30) Foreign Application Priority Data

Mar. 23, 2018 (KR) .................. 10-2018-0033909

(51) Int. Cl.
*C09J 7/29* (2018.01)
*C09J 133/08* (2006.01)
*H01L 21/683* (2006.01)

(52) U.S. Cl.
CPC ............ *C09J 7/29* (2018.01); *C09J 133/08* (2013.01); *H01L 21/6836* (2013.01); *C09J 2301/122* (2020.08); *C09J 2301/208* (2020.08); *C09J 2301/30* (2020.08); *C09J 2475/006* (2013.01); *Y10T 428/2809* (2015.01); *Y10T 428/2848* (2015.01); *Y10T 428/2891* (2015.01)

(58) Field of Classification Search
None
See application file for complete search history.

(56) References Cited

U.S. PATENT DOCUMENTS

| 2004/0014865 | A1  | 1/2004 | Keller et al. |
| 2007/0071969 | A1  | 3/2007 | Kontani et al. |
| 2008/0020575 | A1  | 1/2008 | Saimoto et al. |
| 2008/0233392 | A1* | 9/2008 | Tanaka ................... C08G 18/73 428/345 |
| 2012/0034437 | A1  | 2/2012 | Puligadda et al. |
| 2015/0174726 | A1  | 6/2015 | Litke et al. |
| 2016/0003983 | A1  | 1/2016 | Park et al. |
| 2016/0040016 | A1  | 2/2016 | Kang et al. |
| 2016/0282902 | A1  | 9/2016 | Kang et al. |
| 2017/0025303 | A1  | 1/2017 | Morita et al. |
| 2017/0298506 | A1  | 10/2017 | Lorenz |
| 2019/0225834 | A1  | 7/2019 | Ho et al. |
| 2019/0382633 | A1* | 12/2019 | Aizawa .................. C08G 18/44 |

FOREIGN PATENT DOCUMENTS

| CN | 1935922 A | 3/2007 |
| EP | 1767607 A1 | 3/2007 |
| JP | H08-311412 A | 11/1996 |
| JP | 2004-106515 A | 4/2004 |
| JP | 2004-107644 A | 4/2004 |
| JP | 2004-511618 A | 4/2004 |
| JP | 2005-116652 A | 4/2005 |
| JP | 2007-084722 A | 4/2007 |
| JP | 2012-528487 A | 11/2012 |
| JP | 2013-535838 A | 9/2013 |
| JP | 2015-157931 A | 9/2015 |
| JP | 2016-511318 A | 4/2016 |
| JP | 2016-538159 A | 12/2016 |
| JP | 2016-541005 A | 12/2016 |
| JP | 2017-514932 A | 6/2017 |
| JP | 2017-536690 A | 12/2017 |
| KR | 10-2007-0033892 A | 3/2007 |
| KR | 10-2007-0087104 A | 8/2007 |
| KR | 10-2014-0133504 A | 11/2014 |
| KR | 10-2015-0087222 A | 7/2015 |
| KR | 10-2015-0109684 A | 10/2015 |
| KR | 10-1596664 B1 | 3/2016 |
| KR | 10-2016-0144370 A | 12/2016 |
| KR | 10-2017-0055552 A | 5/2017 |
| KR | 10-2017-0099695 A | 9/2017 |
| KR | 10-2017-0114728 A | 10/2017 |
| TW | 200716720 A | 5/2007 |
| TW | 201700666 A | 1/2017 |
| WO | 2013-122060 A1 | 8/2013 |
| WO | 2014-080918 A1 | 5/2014 |
| WO | 2016-056269 A1 | 4/2016 |
| WO | 2016-121488 A1 | 8/2016 |
| WO | WO-2018066480 A1 * | 4/2018 ............ C09J 133/00 |

OTHER PUBLICATIONS

International Search Report and Written Opinion issued for International Application No. PCT/KR2019/002671 dated Jun. 28, 2019, 4 pages.
Souheng Wu (1971) "Calculation of Interfacial Tension in Polymer Systems," Journal of Polymer Science, vol. 34, pp. 19-30.
Souheng Wu (1973) "Polar and Nonpolar Interactions in Adhesion," The Journal of Adhesion, 5:1, pp. 39-55, DOI: 10.1080/00218467308078437.

(Continued)

*Primary Examiner* — Anish P Desai
(74) *Attorney, Agent, or Firm* — Rothwell, Figg, Ernst & Manbeck, P.C.

(57) ABSTRACT

A back grinding tape including a hard coating layer, an intermediate layer including a polyurethane-based resin, and an adhesive layer provided has an excellent water resistance, thus easily protecting patterns, and has an excellent adhesion between each layer, and thus each layer is not separated in the process of removing the tape, such that the back grinding tape is suitable for a back grinding process.

11 Claims, 1 Drawing Sheet

(56) References Cited

OTHER PUBLICATIONS

Extended European Search Report dated Feb. 12, 2021, of the corresponding European Patent Application No. 19772079.0, 14 pages.
Thomson Scientific, London, GB; AN 2004-453412, Apr. 8, 2004, 3 pages.
Thomson Scientific, London, GB; AN 2004-470730, Apr. 8, 2004, 2 pages.
Thomson Scientific, London, GB; AN 2017-72700Y, Oct. 16, 2017, 3 pages.

* cited by examiner

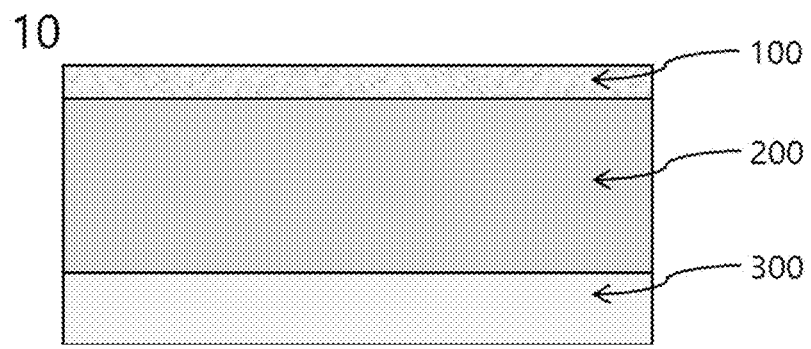

BACK-GRINDING TAPE

CROSS-REFERENCE TO RELATED APPLICATION(S)

This application is a 35 U.S.C. 371 National Phase Entry Application from PCT/KR2019/002671 filed on Mar. 7, 2019, designating the United States, which claims the benefit of Korean Patent Application No. 10-2018-0033909 filed on Mar. 23, 2018 with the Korean Intellectual Property Office, the disclosures of which are herein incorporated by reference in their entirety.

TECHNICAL FIELD

The present invention relates to a back grinding tape, specifically, to an adhesive tape that is attached on the surface of a semiconductor wafer in a back grinding process during the preparation process of semiconductor, and functions to protect the surface.

BACKGROUND ART

Recently, with a growing tendency towards miniaturization, high functionality, and large capacity of electronic devices, a demand for high density and high integration of semiconductor packages is rapidly increasing. Reflecting this, the size of a semiconductor chip is increasing more and more, and simultaneously, the thickness of a chip is becoming thinner, and the degree of integration of a circuit is increasing. However, the modulus of a semiconductor chip itself is decreasing, thus causing a problem in terms of reliability of the preparation process or the final product.

According to such a demand for large and thin semiconductor, a back grinding process is essentially conducted, wherein the rear side of a wafer is ground with an abrasive wheel consisting of fine diamond particles to form the thickness of a chip thin, thereby facilitating the assembly, but during the back grinding process, damage to the wafer such as pollution by a large quantity of silicon dust and particles as well as crack generation is frequently generated. Thus, the function of a back grinding tape for protecting the surface of a semiconductor wafer is becoming more important.

In order to smoothly progress the back grinding process, a back grinding tape should effectively protect the pattern side of a wafer, and after the grinding process is completed, it should be easily removed without residue, and thus various studies on the improvement in adhesive force and other properties of a back grinding tape are under progress.

Meanwhile, in case the back grinding tape consists of multiple layers, each layer may be separated during the removal of the back grinding tape, and thus there is a demand for the development of technology capable of simultaneously realizing improvement in the properties for protecting the pattern side and ease of removal.

BRIEF DESCRIPTION OF THE INVENTION

The present invention provides a back grinding tape that is attached on the surface of a wafer to protect the surface, in a back grinding process during the preparation process of a semiconductor.

According to the present invention, a back grinding tape is provided, which includes: a hard coating layer; an intermediate layer including polyurethane-based resin; and an adhesive layer, wherein a sum of polar energy values of the hard coating layer and the intermediate layer is 13 dyne/cm to 17 dyne/cm, and the polar energy value of the intermediate layer is 3.5 dyne/cm or less.

The back grinding tape is an adhesive tape used to protect the surface of a wafer pattern in a back grinding process.

DETAILED DESCRIPTION OF THE INVENTION

Hereinafter, a back grinding tape according to the embodiments of the invention will be explained in detail.

First, technical terms used in the present specification are only for mentioning specific embodiments, and they are not intended to restrict the present invention unless there is a particular mention about them.

A singular expression includes a plural expression thereof, unless it is expressly stated or obvious from the context that such is not intended.

As used herein, the terms "comprise", "include", etc. are intended to designate the existence of a practiced characteristic, number, step, constructional element, or combinations thereof, and they are not intended to preclude the possibility of existence or addition of one or more other characteristics, numbers, steps, constructional elements, or combinations thereof.

Further, the terms including an ordinal number such as "first", "second", and the like are used to distinguish one constructional element from other constructional elements, and the present invention is not limited thereby. For example, a first constructional element may be called a second constructional element within the scope of the right of the present invention, and similarly, a second constructional element may be called a first constructional element.

In addition, in case it is stated that any constructional element is formed "on the upper part of (or on the lower part of)" or "on (or under)" a base, it means that any constructional element is formed in contact with the upper side (or lower side) of the base, or that other constructional elements may be additionally included between the base and any constructions formed on (or under) the base.

As used herein, (meth)acrylate means both acrylate and methacrylate.

FIG. 1 shows the cross-sectional structure of a back grinding tape (10) according to one embodiment, According to FIG. 1, the back grinding tape (10) may include a hard coating layer (100), an intermediate layer including a polyurethane-based resin (200), and an adhesive layer (300). The hard coating layer (100), the intermediate layer including the polyurethane-based resin (200), and the adhesive layer (300) may be sequentially stacked, and on any one side, or between two layers of the hard coating layer (100), the intermediate layer including the polyurethane-based resin (200), and the adhesive layer (300), a predetermined functional layer may be additionally formed.

Further, in case the back grinding tape (10) is used in a back grinding process, the adhesive layer (300) may be attached adjacent to a wafer pattern.

In the present invention, a hard coating layer (100) may be positioned on the lower side, and an intermediate layer (200) and an adhesive layer (300) may be stacked thereon.

The back grinding tape (10) according to one embodiment of the invention may be used to protect the surface of a wafer pattern, in a back grinding process during the preparation process of a semiconductor.

A tape used in a back grinding process may consist of multiple layers, but in this case, each layer may be separated in the step of removing the tape, and thus sufficient adhesion between each layer is required. The tape may absorb water or solvents and the like used in the back grinding process to cause faulty patterns. However, since water resistance and adhesion of such an adhesive tape are in a trade-off relationship with each other, it was difficult to simultaneously secure the properties.

Thus, the present inventors simultaneously realized excellent water resistance of a tape and excellent adhesion between each layer, by drawing specific parameters from contact angles respectively measured at a hard coating layer (100) and an intermediate layer including polyurethane-based resin (200).

The back grinding tape (10) according to the present invention fulfills the requirements that the sum of the polar energy values of the hard coating layer (100) and the intermediate layer (200) including the polyurethane-based resin is 13 dyne/cm to 17 dyne/cm, and the polar energy value of the intermediate layer (200) including the polyurethane-based resin is 3.5 dyne/cm or less, thereby securing excellent water resistance and interlayer adhesion. Thus, a back grinding process may be smoothly conducted, and a film may be easily removed after the process is completed, thereby improving the reliability of a semiconductor chip.

In the back grinding tape (10) according to the present invention, if the sum of the polar energy values of the hard coating layer (100) and the intermediate layer (200) including the polyurethane-based resin is less than 13 dyne/cm, interlayer adhesion may be deteriorated, and thus it may be difficult to smoothly conduct a back grinding process, and each layer may be separated in the step of removing the film after the back grinding process is completed. Further, if the sum of the polar energy values of the two layers is greater than 17 dyne/cm, hygroscopicity may be increased to influence the pattern, and due to a change in the thickness of a film, it may be difficult to uniformly conduct the process.

In the back grinding tape (10) according to the present invention, if the polar energy value of the intermediate layer (200) including the polyurethane-based resin is greater than 3.5 dyne/cm, water resistance may be remarkably deteriorated, thus causing faulty patterns in a back grinding process.

In addition, preferably, the requirements that the sum of the polar energy values is 13.3 dyne/cm to 16 dyne/cm and that the polar energy value of the intermediate layer (200) including the polyurethane-based resin is 3.0 dyne/cm or less may be simultaneously fulfilled, and in case, the above-explained effect may be maximized.

In the present invention, the polar energy is a value measured respectively on the surface of the hard coating layer (100) and the intermediate layer (200) including the polyurethane-based resin according to the following Mathematical Equation 1. The surface energy of the polymer material cannot be directly measured because the polymer material has viscosity and elasticity, and thus the surface energy is indirectly calculated through the measurement of a contact angle. In the present invention, according to a Wu-Harmonic method, contact angles on each measurement object side are measured using two measurement solutions (water and a diiodomethane ($CH_2I_2$) solutions), and are introduced into the Wu-Harmonic Equation to calculate surface energy and dispersion, and polar energy is deduced therefrom.

Polar Energy (dyne/cm)=Surface free energy (dyne/cm)−Dispersion (dyne/cm)  [Mathematical Equation 1]

In the equation, the surface free energy and dispersion are measured using water and diiodomethane ($CH_2I_2$) solutions according to the Wu-harmonic method.

In the present invention, the Wu-Harmonic Equation is an equation that is commonly used in the art, and contact angles using a polar solvent of water and a non-polar solvent of diiodomethane, and unique surface tensions thereof are introduced in the Wu-Harmonic Equation to respectively design two equations, and from the arithmetic mean thereof, the surface free energy and dispersion values of the present invention may be calculated.

For such measurement of surface free energy and dispersion according to the Wu-Harmonic Equation, the disclosures of Reference 1 (S. Wu, Calculation of Interfacial Tensions in Polymer Systems. In: J. Polym. Sci. 43 (1971), P. 19-30.) and Reference 2 (S. Wu, Polar and Nonpolar Interaction in Adhesion. In: J. Adhesion 5 (1973), P. 39-55.) may be applied. Further, it may be calculated from ADVANCE software that is commercially available from KRUSS Company.

For example, in Mathematical Equation 1 of the present invention, surface free energy and dispersion may be deduced by simultaneous equations of the following Mathematical Equation 1-1 and Mathematical Equation 1-2.

The surface free energy of Mathematical Equation 1 corresponds to as in the following Mathematical Equations 1-1 and 1-2, the polar energy corresponds to $\sigma_s^D$ (polar part of the surface energy of a solid), and the dispersion corresponds to $\sigma_s^{ND}$ (non-polar part of the surface energy of a solid). That is, $\sigma_s = \sigma_s^D + \sigma_s^{ND}$ (or $\sigma_s^D = \sigma_s - \sigma_s^{ND}$) is fulfilled.

The following Mathematical Equation 1-1 is the Young's Equation.

$$\sigma_s = \sigma_{sl} + \sigma_l \cdot \cos\theta \quad \text{[Mathematical Equation 1-1]}$$

In Mathematical Equation 1-1, as is surface free energy of a solid, θ is a contact angle measurement on the surface of an object, $\sigma_l$ is surface tension of a liquid, and $\sigma_{sl}$ is interfacial tension between a liquid and a solid. Herein, the contact angle is a value obtained through experiments, and the surface tension of a liquid is the unique value of water or iodomethane.

In addition, as, the interfacial tension between a liquid a and solid, can be deduced from the Fowkes method of the following Mathematical Equation 1-2.

$$\sigma_{ls} = \sigma_l + \sigma_s - 2(\sqrt{\sigma_l^D \cdot \sigma_s^D} + \sqrt{\sigma_l^{ND} \cdot \sigma_s^{ND}}) \quad \text{[Mathematical Equation 1-2]}$$

In Mathematical Equation 1-2, as is surface free energy of a solid, $\sigma_l$ is surface tension of a liquid, $\sigma_s^D$ is the polar part of the surface energy of a solid, $\sigma_s^{ND}$ is the non-polar part of the surface energy of a solid, $\sigma_l^D$ is the polar part of the surface tension of a liquid, and $\sigma_l^{ND}$ is the non-polar part of the surface tension of a liquid.

Through the simultaneous equations of the above Mathematical Equation 1-1 and Mathematical Equation 1-2, the surface free energy value and dispersion value of the polymer layer for each solvent can be deduced, and through the arithmetic mean thereof, the surface free energy value and dispersion value of the present invention can be deduced.

Hard Coating Layer (100)

In the back grinding tape (10) according to one embodiment of the present invention, the hard coating layer (100) is the outermost layer for protecting a pattern from the external foreign substances (abrasives, solvents, and the like used in a grinding process) and physical impact and the like in the back grinding process, and a material realizing optimum strength may be selected therefor.

In the present invention, the hard coating layer (100) fulfills specific a polar energy parameter value as explained above, thus exhibiting excellent water resistance, and has excellent adhesion to the lower layer, and thus is suitable for use as a film for a back grinding process.

The hard coating layer (100) may have a thickness of 0.1 μm to 10 μm, and preferably 1 μm to 5 μm, and if the above thickness range is fulfilled, handling may be easy while realizing optimum strength, and generation of unnecessary steps may be prevented in the back grinding process.

If the thickness of the hard coating layer is less than 0.1 μm, a blocking prevention effect may be insignificant, and if it is greater than 10 μm, bubble generation may increase when attached to a wafer, and stress relaxation of a film may be deteriorated.

As the hard coating layer (100), materials capable of fulfilling the above-explained polar parameters may be appropriately selected, and specifically, it may include one or more selected from the group consisting of polyester-based compounds, acryl-based compounds, modified urethane-based compounds, cellulose acetate-based compounds, and polycaprolactone-based compounds.

The hard coating layer (100) may be prepared by an extrusion process, a casting process, a calendaring process, a heat curing process, or a photocuring process, and in case the hard coating layer is formed by the photocuring process, it may be formed by applying a composition for forming a hard coating layer including curable monomers, a photocuring initiator, and additional additives, in addition to the above-explained components, on a base film, and photocuring.

The base film may be formed of a releasable material, and it may be removed after an intermediate layer (200) including a polyurethane-based polymer and an adhesive layer (300) are formed thereon.

Intermediate Layer Including Polyurethane-Based Resin (200)

In the back grinding tape (10) according to one embodiment of the present invention, the intermediate layer (200) including the polyurethane-based resin is formed on the hard coating layer (100), and it is a layer for protecting a pattern from the external foreign substances (abrasives, solvents, and the like used in a grinding process) and physical impact and the like, and materials having excellent stress relaxation may be selected therefor.

In the present invention, the intermediate layer (200) including the polyurethane-based resin fulfills the specific polar energy parameter value as explained above, thus exhibiting excellent water resistance, and has excellent adhesion to the lower hard coating layer (100), and thus is suitable for use as a film for a back grinding process.

The intermediate layer (200) including polyurethane-based resin may have a thickness of 50 μm to 500 μm, and preferably, 100 μm to 300 μm, and in case it fulfills the above thickness range, it may realize optimum stress relaxation, and thus is suitable for protecting a pattern from the external physical impact, and particularly, even if it absorbs external moisture, an influence on the pattern side may be minimized. If the thickness of the intermediate layer is less than 50 μm, it may have slightly insufficient durability, and thus it may be difficult to perform a function as a support.

The intermediate layer (200) including polyurethane-based resin may be formed of a composition for forming an intermediate layer including the polyurethane-based resin, acrylate-based monomers, a curing agent, and a photoinitiator.

The polyurethane-based resin is a polymer resin having a urethane bond (—NHCOO—) in the repeat unit of a main chain, and it may be formed by condensation polymerization of diol-based compounds and diisocyanate compounds.

As specific examples of the diol-based compounds used to synthesize the polyurethane-based resin, ethylene glycol, 1,4-butane diol, diethylene glycol, polycarbonate diol, and the like may be mentioned, but are not limited thereto, and these compounds may be used alone or in combinations of two or more kinds.

As specific examples of the isocyanate used to synthesize the polyurethane resin, isocyanates having 4 to 20 carbon atoms, for example, tetramethylene 1,4-diisocyante, pentamethylene 1,5-diisocyante, hexamethylene 1,6-diisocynate, 2-methyl-1,5-diisocynatopentane, octamethylene 1,8-diisocynate, decamethylene 1,10-diisocynate, dodecamethylene 1,12-diisocynate, tetradecamethylene 1,14-diisocynate, 2,2,4- and 2,4,4-trimethylhexane isocyanate, 1,3-bis (1-isocyanato-1-methylethyl)benzene (m-TMXDI), lysine diisocyanate derivates, and the like may be mentioned, and mixtures of the above described isocyanates may be used. Further, isoboron diisocyanate, diphenylmethane-4,4'diisocyanate, isophorone diisocyanate, toluene diisocyanate, and the like may be mentioned. These compounds may be used alone or in combinations of two or more kinds.

For the synthesis of the polyurethane-based resin, (meth)acrylate-based monomers as diluent monomers and a hydroxyl group-containing (meth)acrylate as an end capping agent may be further included. However, the diluent monomers do not participate in the reaction, and thus may remain. The components of (meth)acrylate-based monomers described below may be applied therefor.

The content of the polyurethane-based resin may be 10 to 40 wt %, preferably 15 to 35 wt %, or 20 to 30 wt %, based on the total weight of the composition, and if used in the above content range, water resistance of the final multilayered film and interlayer adhesion may be simultaneously improved.

As specific examples of the acrylate-based monomers, aliphatic (meth)acrylates, alicyclic (meth)acrylates, aromatic (meth)acrylates, hydroxy group-containing (meth)acrylates, carboxyl group-containing (meth)acrylates, and the like may be mentioned. These compounds may be used alone or in combinations of two or more kinds. Among them, hydroxy group-containing (meth)acrylates are preferably used because they are suitable for fulfilling the polar energy parameters defined in the present invention.

As the aliphatic (meth)acrylate, alkyl(meth)acrylates having an alkyl group of a carbon number of 1 to 20 may be mentioned, and specifically, methyl (meth)acrylate, ethyl (meth)acrylate, n-propyl (meth)acrylate, isopropyl (meth)acrylate, n-butyl (meth)acrylate, t-butyl (meth)acrylate, sec-butyl (meth)acrylate, pentyl (meth)acrylate, 2-ethylhexyl (meth)acrylate, 2-ethylbutyl (meth)acrylate, n-octyl (meth)acrylate, isooctyl (meth)acrylate, isononyl (meth)acrylate, and the like may be mentioned. These compounds may be used alone or in combinations of two or more kinds.

As the alicyclic (meth)acrylate, cycloalkyl(meth)acrylates having a cycloalkyl group of a carbon number of 3 to 30 may be mentioned, and specifically, isobornyl acrylate (IBOA), trimethylcyclohexyl acrylate, cyclopentyl (meth)acrylate, cyclohexyl (meth)acrylate, dicyclopentanyl methacrylate, dicyclopentenyl oxy(meth)acrylate, and the like may be mentioned. These compounds may be used alone or in combinations of two or more kinds.

As the aromatic (meth)acrylate, alkyl (meth)acrylates having an aromatic group of a carbon number of 6 to 30 may be mentioned, and specifically, phenylhydroxypropyl (meth)acrylate, o-phenylphenol EO (meth)acrylate, 2-hydroxy-3-phenylphenoxypropyl (meth)acrylate, phenol EO (meth)acrylate, and the like may be mentioned. These compounds may be used alone or in combinations of two or more kinds.

As the hydroxyl group containing (meth)acrylate, 2-hydroxyethyl (meth)acrylate, 4-hydroxybutyl (meth)acrylate, and the like may be mentioned, and as the carboxyl group-containing (meth)acrylate, (meth)acrylic acid, crotonic acid, maleic acid, fumaric acid, and the like may be mentioned. These compounds may be used alone or in combinations of two or more kinds.

The content of the acrylate-based monomers may be 50 to 85 wt %, preferably 65 to 80 wt %, based on the total weight of the composition, and if used in the above content range, economic efficiency may be excellent while realizing optimum curing efficiency. In the acrylate-based monomers, the diluent monomers used during the synthesis of the polyurethane-based resin may be included.

In case hydroxyl group-containing (meth)acrylate is included in the acrylate-based monomers, the hydroxyl group containing (meth)acrylate does not participate in the photocuring reaction for forming an intermediate layer, and thus, after forming an intermediate layer, it influences the polar energy parameter desired in the present invention. Thus, the hydroxyl group-containing (meth)acrylate may be included in the content of 1 to 25 wt %, preferably 5 to 15 wt %, based on the total content of the composition, and if included in the above content range, it may be suitable for fulfilling the polar energy parameters defined in the present invention, and thereby simultaneously improve water resistance of the final multilayered film and interlayer adhesion. Meanwhile, acrylate-based monomers other than the hydroxyl group-containing (meth)acrylate may be included in the remaining content so as to fulfill the above-explained range (40 to 90 wt %).

As specific examples of the curing agent, polar monomers such as multifunctional acrylates may be mentioned, and specifically, 1,4-butandiol di(meth)acrylate, 1,6-hexandiol di(meth)acrylate, neopentyl glycol di(meth)acrylate, 1,2-ethylene glycol di(meth)acrylate, polyethylene glycol di(meth)acrylate, 1,12-dodecanediol di(meth)acrylate, neopentyl glycol adipate di(meth)acrylate, neopentyl glycol hydroxypivalate di(meth)acrylate, dicyclopentanyl di(meth)acrylate, caprolactone modified dicyclopentenyl di(meth)acrylate, ethylene oxide modified di(meth)acrylate, di(meth)acryloxy ethyl isocyanurate, allylated cyclohexyl di(meth)acrylate, tricyclodecanedimethanol (meth)acrylate, dimethylol dicyclopentane di(meth)acrylate, ethylene oxide modified hexahydrophthalate di(meth)acrylate, tricyclodecane dimethanol (meth)acrylate, neopentyl glycol modified trimethylpropane di(meth)acrylate, adamantane di(meth)acrylate, 9,9-bis[4-(2-acryloyloxyethoxy)phenyl]fluorene, trimethylolpropane tri(meth)acrylate, dipentaerythritol tri(meth)acrylate, propionic acid modified dipentaerythritol tri(meth)acrylate, dipentaerythritol tri(meth)acrylate, propylene oxide modified trimethylolpropane tri(meth)acrylate, tris(meth)acryloxy ethyl isocyanurate, diglycerin tetra(meth)acrylate, dipentaerythritol tetra(meth)acrylate, propionic acid modified dipentaerythritol penta(meth)acrylate, dipentaerythritol hexa(meth)acrylate, caprolactone modified dipentaerythritol hexa(meth)acrylate, and urethane (meth)acrylate, the reaction product of isocyanate monomers and trimethylolpropane tri(meth)acrylate, and the like may be mentioned. These compounds may be used alone or in combinations of two or more kinds.

The content of the curing agent may be 0.1 to 5 wt %, preferably 0.5 to 2 wt %, based on the total weight of the composition for forming an intermediate layer, and if used in the above content range, economical efficiency may be excellent while realizing optimum curing efficiency.

The photoinitiator is not specifically limited as long as it initiates a photocuring reaction by light irradiation, and as specific examples thereof, benzoin methyl ether, 2,4,6-trimethylbenzoyl diphenylphosphine oxide, bis(2,4,6-trimethylbenzoyl) phenylphosphine oxide, α,α-methoxy-α-hydroxyacetophenone, 2-benzoyl-2-(dimethylamino)-1-[4-(4-morphonyl)phenyl]-1-butanone, 2,2-dimethoxy-2-phenylacetophenone, 2, 2-dimethoxy-1,2-diphenylethan-1-one, 1-hydroxy-cyclohexyl-phenylketone, 2-benzyl-2-(dimethylamino)-1-[4-(4-morpholinyl)phenyl]-1-butanone, and the like may be mentioned. These compounds may be used alone or in combinations of two or more kinds.

The photoinitiator may be used in the content of 0.1 to 5 wt %, preferably 0.3 to 1.5 wt %, based on the total weight of the composition for forming an intermediate layer, and if used in the above content range, excellent economic efficiency may be obtained while realizing optimum photocuring efficiency.

The intermediate layer (200) including the polyurethane-based resin may be prepared by a photocuring process, and it may be formed by applying the composition for forming an intermediate layer including the polyurethane-based resin as explained above with regard to the hard coating layer (100), and photocuring.

Adhesive Layer (300)

In the back grinding tape (10) according to one embodiment of the present invention, the adhesive layer (300) is formed on the intermediate layer (200) including the polyurethane-based resin, it is a layer attached adjacent to a wafer pattern, and a photocurable pressure-sensitive adhesive material may be selected therefor.

In the present invention, the adhesive layer (300) should have appropriate adhesive force when processing a product such as a semiconductor wafer, and thus should be definitely attached to the semiconductor wafer during the process, and it should be easily peeled off without applying a load to the product after processing. Thus, it is preferable that a material containing a certain amount of a heat curing agent and a photoinitiator is used therefor.

It is preferable that materials that form a film on the intermediate layer (200) including the polyurethane-based resin by heat curing to prepare an adhesive film for protecting the surface of the semiconductor wafer, and after a back grinding process is completed, can be peeled off from the surface of the wafer by additional light irradiation, are applied for the adhesive layer (300).

The adhesive layer (300) may have a thickness of 0.5 μm to 60 μm, preferably, 1 μm to 50 μm or 5 μm to 40 μm, and if the thickness of the adhesive layer fulfills the above thickness range, it can be easily adhered to and peeled off from the surface of a wafer, and if the thickness of the adhesive layer does not fall within the above range, it may be difficult to obtain a uniform adhesive layer, and the properties of the film may become non-uniform. If the thickness is less than 0.5 μm, the thickness of the layer may be too thin, thus deteriorating adhesive force, and to the contrary, if the thickness is greater than 60 μm, due to the excessive thickness, a residue may remain on the surface of a wafer when removing the adhesive film.

The adhesive layer (300) may include an acrylate-based thermosetting resin, and it may further include a solvent, a heat curing agent, and a photoinitiator. The acrylate-based thermosetting resin may be prepared by mixing acrylate-based monomers, a polymerization initiator, and a solvent to conduct a polymerization reaction, and reacting the polymerized acrylate-based polymer with a curing agent.

The adhesive layer (300) may be formed by applying a composition for forming an adhesive layer including the above-explained components, additional additives, and solvents on the intermediate layer (200) including the polyurethane-based resin, and heat curing, or by forming it on a separate releasable base film, and then binding it to a polyurethane-based film layer (200).

The back grinding tape (100) according to one embodiment of the present invention includes: a hard coating layer; an intermediate layer including the polyurethane-based resin; and an adhesive layer, and fulfills specific polar energy parameters as explained above, thereby easily preventing damage to circuit patterns and the like existing on the surface during the precision processing of a semiconductor wafer, or pollution of a semiconductor wafer by foreign substances, moisture, or chemicals generated during the process. Further, since the back grinding tape (10) fulfills the above-explained properties, it can be removed without peel-off residue, after the precision processing of a semiconductor wafer is completed.

Advantageous Effects

The back grinding tape according to the present invention has excellent water resistance, thus easily protecting a pattern, and has excellent interlayer adhesion, and thus each layer is not separated during the process of removing a film, thus providing a tape suitable for a back grinding process.

BRIEF DESCRIPTION OF DRAWINGS

FIG. 1 shows the cross-sectional structure of a back grinding tape (10) according to one embodiment of the present invention.

DETAILED DESCRIPTION OF THE EMBODIMENTS

Hereinafter, preferable examples are presented for better understanding of the invention. However, the following examples are presented only as illustrations of the invention, and the scope of the present invention is not limited thereby.

Preparation Example 1: A Composition for Forming a Hard Coating Layer

Preparation Example 1-1: A Composition for Forming a Hard Coating Layer 40 g of PS1000 (including a polycaprolactone-based compound) from Cho Kwang Paint, 8 g of PS1000 blue, and 7 g of a diluent solvent of methylethylketone (MEK) were mixed to prepare a composition for forming a hard coating layer (1-1).

Preparation Example 1-2: A Composition for Forming a Hard Coating Layer 50 g of CAP varnish (including a cellulose acetate-based compound) of Sam Young Ink, and 50 g of a diluent solvent of methylethylketone (MEK) were mixed to prepare a composition for forming a hard coating layer (1-2).

Preparation Example 1-3: A Composition for Forming a Hard Coating Layer 30 g of A-PET 328 varnish (including a polyester-based compound) of Sam Young Ink, 10 g of acrylic blue (T-6), 20 g of methylethylketone (MEK), and 0.15 g of LP.SUPER curing agent of Sam Young Ink were mixed to prepare a composition for forming a hard coating layer (1-3).

Preparation Example 1-4: A Composition for Forming a Hard Coating Layer 6 g of polymer silicone resin KS-3650 of Shin-Etsu silicone, 0.1 g of a platinum catalyst PL-50T, 50 g of a solvent of toluene, and 50 g of methylethylketone (MEK) were mixed to prepare a composition for forming a hard coating layer (1-4).

Preparation Example 2: A Composition for Forming an Intermediate Layer Including Polyurethane-Based Resin Preparation Example 2-1: A Composition for Forming an Intermediate Layer Including Polyurethane-Based Resin 21 g of polycarbonate diol, 3 g of isophorone diisocyanate (IPDI), and 21 g of diluent monomers of cyclohexyl methacrylate (CHMA) were mixed to progress a polymerization reaction, and then the end was capped using 1 g of 1-hydroxyethyl methacrylate (1-HEMA) to synthesize a polyurethane oligomer having a weight average molecular weight of 30,000 g/mol.

Next, 25 g of the above-prepared polyurethane oligomer, 21 g of a remaining diluent monomer cyclohexyl methacrylate (CHMA), 22 g of o-phenylphenol EO acrylate (OPPEA), 32 g of hydroxyethyl acrylate (HEA), 2 g of a curing agent of 1,6-hexanediol diacrylate (HDDA), and 0.5 g of a photoinitiator Irgacure 651 were mixed to prepared a composition for forming an intermediate layer (2-1).

Preparation Example 2-2: A Composition for Forming an Intermediate Layer Including Polyurethane-Based Resin 21 g of polycarbonate diol, 3 g of isophorone diisocyanate (IPDI), and 21 g of diluent monomers of trimethylcyclohexyl methacrylate (TMCHA) were mixed to progress a polymerization reaction, and then the end was capped using 1 g of 1-hydroxyethyl methacrylate (1-HEMA) to synthesize a polyurethane oligomer having a weight average molecular weight of 30,000 g/mol.

Next, 25 g of the above-prepared polyurethane oligomer, 21 g of a remaining diluent monomer trimethylcyclohexyl methacrylate (TMCHA), 29 g of o-phenylphenol EO acrylate (OPPEA), 10 g of isobornyl acrylate (IBOA), 10 g of hydroxyethyl acrylate (HEA), 5 g of 2-hydroxy-3-phenylphenoxypropyl acrylate, 2 g of a curing agent of 1,6-hexanediol diacrylate (HDDA), and 0.5 g of a photoinitiator Irgacure 651 were mixed to prepared a composition for forming an intermediate layer (2-2).

Preparation Example 2-3: A Composition for Forming an Intermediate Layer Including Polyurethane-Based Resin 21 g of polycarbonate diol, 3 g of isophorone diisocyanate (IPDI), and 33 g of diluent monomers of isobornyl acrylate (IBOA) were mixed to progress a polymerization reaction, and then the end was capped using 1 g of 1-hydroxyethyl methacrylate (1-HEMA) to synthesize a polyurethane oligomer having a weight average molecular weight of 30,000 g/mol.

Next, 25 g of the above-prepared polyurethane oligomer, 33 g of a remaining diluent monomer trimethylcyclohexyl methacrylate (TMCHA), 22 g of o-phenylphenol EO acrylate (OPPEA), 15 g of hydroxyethyl acrylate (HEA), 5 g of hydroxyethyl acrylate (HEA), 2 g of a curing agent 1,6-hexanediol diacrylate (HDDA), and 0.5 g of a photoinitiator Irgacure 651 were mixed to prepare a composition for forming an intermediate layer (2-3).

Preparation Example 3: A Composition for Forming an Adhesive Layer 72 g of 2-ethylhexyl acrylate (2-EHA), 13 g of 2-hydroxyethyl acrylate (2-HEA), 0.1 g of a polymerization initiator of benzoyl peroxide, and 100 g of methylethyl ketone (MEK) were used to prepare 185 g of an acryl-based polymer.

100 g of the above-prepared acryl-based polymer and 15 g of methacryloyloxy ethyl isocyanate (MOI) were reacted to prepare an acryl-based thermosetting resin.

30 g of the prepared thermosetting resin and 70 g of methylethyl ketone (MEK) were mixed to prepare a thermosetting composition for forming an adhesive layer.

Example 1

On a releasable film (LO2, YoulChon Chemical), the composition for forming a hard coating layer according to Preparation Example 1-2 was applied, and heat cured at 110° C. for 2 minutes to form a hard coating layer with a thickness of 1.0 μm.

Next, on the hard coating layer, the composition for forming a polyurethane film according to Preparation Example 2-2 was applied, and a transparent releasable base film was laminated on the coating layer so as to block oxygen, and cured using a UV lamp having a main wavelength of 365 nm to prepare a polyurethane-based intermediate layer having a thickness of 160 μm. Thereafter, the transparent releasable base film was removed.

On a releasable film, the composition for forming an adhesive layer according to Preparation Example 3 was applied, and left in an oven at 110° C. for 3 minutes to form an adhesive layer having a thickness of 20 μm. Next, it was laminated with the polyurethane intermediate layer to finally prepare an adhesive film (a releasable film) for a semiconductor process including a hard coating layer, an intermediate layer including a polyurethane-based resin, and an adhesive layer (a releasable film) that were sequentially stacked. The releasable film formed on the adhesive layer can be removed immediately before a back grinding process.

Examples 2 to 4 and Comparative Examples 1 to 11

A back grinding tape was prepared by the same method as Example 1, using the components in the following Table 1 in combination.

However, in case a composition for forming a hard coating layer of Preparation Example 1-1 was used when forming a hard coating layer, after the composition was applied, it was heat dried at 70° C. for 1 minute, and irradiated by metal halide lamp UV at 800 mJ/cm² UV-A to form a hard coating layer.

TABLE 1

| | Hard coating layer | | Polyurethane intermediate layer | | Sum of polar energy (①+②) |
|---|---|---|---|---|---|
| | Component | Polar energy (①) | Component | Polar energy (②) | |
| Example 1 | Preparation Example 1-2 | 13.0 | Preparation Example 2-2 | 2.2 | 15.2 |
| Example 2 | Preparation Example 1-3 | 12.3 | Preparation Example 2-2 | 2.2 | 14.5 |
| Example 3 | Preparation Example 1-2 | 13.0 | Preparation Example 2-3 | 1.1 | 14.1 |
| Example 4 | Preparation Example 1-3 | 12.3 | Preparation Example 2-3 | 1.1 | 13.4 |
| Comparative Example 1 | Preparation Example 1-1 | 10.3 | Preparation Example 2-1 | 4.0 | 14.3 |
| Comparative Example 2 | Preparation Example 1-1 | 10.3 | Preparation Example 2-2 | 2.2 | 12.5 |
| Comparative Example 3 | Preparation Example 1-1 | 10.3 | Preparation Example 2-3 | 1.1 | 11.4 |
| Comparative Example 4 | Preparation Example 1-2 | 13.0 | Preparation Example 2-1 | 4.0 | 17.0 |
| Comparative Example 5 | Preparation Example 1-3 | 12.3 | Preparation Example 2-1 | 4.0 | 16.3 |
| Comparative Example 6 | Preparation Example 1-4 | 3.0 | Preparation Example 2-1 | 4.0 | 7.0 |
| Comparative Example 7 | Preparation Example 1-4 | 3.0 | Preparation Example 2-2 | 2.2 | 5.2 |
| Comparative Example 8 | Preparation Example 1-4 | 3.0 | Preparation Example 2-3 | 1.1 | 4.1 |

Experimental Example

For the back grinding tapes prepared in the examples and comparative examples, the properties were evaluated as follows, and the results are shown in the following Table 2.

1) Polar Energy Parameters

During the preparation processes of the examples and comparative examples, the composition for forming a hard coating layer was separately applied on a releasable base film, a hard coating layer was formed with a thickness of 1.0 μm by the same method as Example 1, and it was prepared into a sample of 20×50 mm.

During the preparation processes of the examples and comparative examples, the composition for forming an intermediate layer including a polyurethane-based resin was separately applied on a base film, an intermediate layer including a polyurethane-based resin was formed with a thickness of 160 μm by the same method as Example 1, and it was prepared into a sample of 20×50 mm.

For each sample prepared, a polar energy value was measured according to the following Mathematical Equation 1, and the results are shown in Table 1.

Polar Energy (dyne/$cm$)=Surface free energy (dyne/$cm$)−Dispersion (dyne/$cm$)   [Mathematical Equation 1]

2) Evaluation of Water Resistance

During the preparation processes of the examples and comparative examples, the composition for forming an intermediate layer including a polyurethane-based resin was separated applied on a releasable base film, and an intermediate layer including a polyurethane-based resin was formed with a thickness of 160 μm (①) by the same method, and it was prepared into a sample of 20×50 mm.

The sample was immersed in distilled water of about 25° C. for 60 minutes, and then the thickness of the sample (②) was measured, a thickness change rate before and after immersion ((②−①/①)*100(%)) was measured, and water resistance was evaluated according to the following standard, and the results are shown in Table 2.

<Water Resistance Evaluation Standard>
◎: 0% to less than 1%
○: 1% or more and less than 2%
Δ: 2% or more and less than 4%
X: 4% or more 3) Evaluation of Adhesive Property For the adhesive films for a semiconductor process prepared in the examples and comparative examples, a cross-cut test was conducted. Specifically, lines were drawn on the sample at an interval of 1 mm to make a checkerboard pattern, and then 3M Magic Tape was attached and pulled in a vertical direction to measure a degree of transcription of the hard coating film during the tape detachment process, and the adhesive property was evaluated according to the following standard, and the results are shown in Table 2.

<Adhesive Property Evaluation Standard>
◎: No transcription
○: 5% or less transcribed
Δ: greater than 5% and 25% or less transcribed
X: 25% or more transcribed

TABLE 2

|  | Water resistance | Adhesive property |
| --- | --- | --- |
| Example 1 | ○ | ○ |
| Example 2 | ○ | ○ |
| Example 3 | ◎ | ○ |
| Example 4 | ◎ | ○ |
| Comparative Example 1 | X | ◎ |
| Comparative Example 2 | ○ | X |
| Comparative Example 3 | ○ | X |
| Comparative Example 4 | X | ◎ |
| Comparative Example 5 | X | ◎ |
| Comparative Example 6 | X | Δ |
| Comparative Example 7 | ○ | X |
| Comparative Example 8 | ○ | X |

As confirmed in Table 2, in the case of the comparative examples wherein polar energy parameters defined in the present invention were not fulfilled, water resistance and adhesive property of the films could not be simultaneously secured.

It was confirmed that the examples of the present invention realized excellent water resistance and adhesive property, and thus, when used in a semiconductor process, particularly aback grinding process, they sufficiently protected a wafer pattern from moisture or external foreign substances, and after the process was completed, they could be easily removed without peel-off residue and layer separation of the film.

EXPLANATION OF SYMBOLS

10: back grinding tape
100: hard coating layer
200: intermediate layer including polyurethane-based resin
300: adhesive layer

The invention claimed is:

1. A back grinding tape comprising: a hard coating layer; an intermediate layer comprising a polyurethane-based resin; and an adhesive layer,
   wherein a sum of polar energy values of the hard coating layer and the intermediate layer calculated according to Mathematical Equation 1 is 13 dyne/cm to 17 dyne/cm, and
   the polar energy value of the intermediate layer calculated according to the Mathematical Equation 1 is 3.5 dyne/cm or less:

Polar Energy (dyne/$cm$)=Surface free energy (dyne/$cm$)−Dispersion (dyne/$cm$)   [Mathematical Equation 1]

wherein, in the Equation, the surface free energy and the dispersion are measured using water and diiodomethane ($CH_2I_2$) solutions according to a Wu-harmonic method,
   wherein a thickness of the hard coating layer is 0.1 μm to 5 μm, and
   wherein the hard coating layer, the intermediate layer and the adhesive layer are sequentially stacked.

2. The back grinding tape according to claim 1, wherein the sum of the polar energy values of the hard coating layer and the intermediate layer is 13.3 dyne/cm to 16 dyne/cm, and the polar energy value of the intermediate layer is 3.0 dyne/cm or less.

3. The back grinding tape according to claim 1, wherein a thickness of the intermediate layer is 50 μm to 500 μm.

4. The back grinding tape according to claim 1, wherein a thickness of the adhesive layer is 0.5 μm to 60 μm.

5. The back grinding tape according to claim 1, wherein the hard coating layer comprises one or more selected from the group consisting of a polyester-based compound, an acryl-based compound, a polyurethane-based compound, a cellulose acetate-based compound, and a polycaprolactone-based compound.

6. The back grinding tape according to claim 1, wherein the intermediate layer is formed by curing a composition comprising the polyurethane-based resin, acrylate-based monomers, a curing agent, and a photoinitiator.

7. The back grinding tape according to claim 6, wherein the acrylate-based monomers include hydroxy group-containing acrylate-based monomers.

8. The back grinding tape according to claim 7, wherein the hydroxy group-containing acrylate-based monomers are included in a content of 1 to 25 wt %, based on total content of the composition.

9. The back grinding tape according to claim 1, wherein the adhesive layer is formed of a composition for forming an adhesive layer comprising an acrylate-based thermosetting resin, a curing agent, a photoinitiator, and a solvent.

10. A wafer pattern, wherein the wafer pattern is attached to the back-grinding tape of claim 1.

11. The back grinding tape according to claim 1, wherein the back grinding tape is used in a back grinding process of a semiconductor wafer.

* * * * *